(12) United States Patent
Choi et al.

(10) Patent No.: US 10,355,063 B2
(45) Date of Patent: Jul. 16, 2019

(54) ORGANIC LIGHT EMITTING DISPLAY PANEL AND ORGANIC LIGHT EMITTING DIODE DISPLAY DEVICE INCLUDING THE SAME

(71) Applicant: LG DISPLAY CO., LTD., Seoul (KR)

(72) Inventors: MoonJung Choi, Seoul (KR); SungJoon Bae, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/202,140

(22) Filed: Jul. 5, 2016

(65) Prior Publication Data

US 2017/0194406 A1    Jul. 6, 2017

(30) Foreign Application Priority Data

Dec. 31, 2015  (KR) .................. 10-2015-0191104

(51) Int. Cl.
```
H01L 27/32      (2006.01)
G09G 3/3266     (2016.01)
G09G 3/3291     (2016.01)
G09G 3/3225     (2016.01)
```

(52) U.S. Cl.
CPC ....... *H01L 27/3262* (2013.01); *G09G 3/3266* (2013.01); *G09G 3/3291* (2013.01); *H01L 27/3211* (2013.01); *H01L 27/3258* (2013.01); *H01L 27/3276* (2013.01); *G09G 3/3225* (2013.01); *G09G 2300/0452* (2013.01); *G09G 2300/0465* (2013.01); *G09G 2310/08* (2013.01); *H01L 27/3213* (2013.01); *H01L 27/3265* (2013.01)

(58) Field of Classification Search
CPC ........ G09G 3/006; G09G 3/30; G09G 3/3208; G09G 3/3225; G09G 2300/0426
USPC .......................................................... 345/76
See application file for complete search history.

(56) References Cited

U.S. PATENT DOCUMENTS

| | | | |
|---|---|---|---|
| 2015/0206933 A1* | 7/2015 | Koshihara | H01L 27/3276 257/40 |
| 2016/0141348 A1* | 5/2016 | Lin | H01L 27/3262 257/40 |
| 2016/0141558 A1* | 5/2016 | Cha | H01L 51/56 257/40 |
| 2016/0260792 A1* | 9/2016 | Kim | H01L 51/5209 |
| 2016/0284267 A1* | 9/2016 | Gil | H01L 27/3276 |
| 2016/0321994 A1* | 11/2016 | Lee | G09G 3/3258 |
| 2016/0322448 A1* | 11/2016 | Kim | H01L 29/7869 |

(Continued)

FOREIGN PATENT DOCUMENTS

| | | |
|---|---|---|
| CN | 1629703 A | 6/2005 |
| EP | 2950299 A1 | 12/2015 |
| JP | 3199940 U | 9/2015 |

*Primary Examiner* — Yuzhen Shen
(74) *Attorney, Agent, or Firm* — Birch, Stewart, Kolasch & Birch, LLP

(57) ABSTRACT

An organic light emitting display panel is discussed, which includes: a data line and a first scan line disposed to intersect each other; a plurality of sub-pixels; a second scan line; a driving voltage line and a reference voltage line; and a plurality of active layers for the plurality of sub-pixels, wherein at least one active layer of at least one sub-pixel among the plurality of sub-pixels overlaps any one of the data line, the driving voltage line, and the reference voltage line, and also overlaps the first or second scan line.

22 Claims, 10 Drawing Sheets

(56) References Cited

U.S. PATENT DOCUMENTS

2017/0033171 A1* 2/2017 Kim .................... H01L 27/3262
2017/0141177 A1* 5/2017 Kim .................... G09G 3/3233

* cited by examiner

ORGANIC LIGHT EMITTING DISPLAY PANEL AND ORGANIC LIGHT EMITTING DIODE DISPLAY DEVICE INCLUDING THE SAME

CROSS-REFERENCE TO RELATED APPLICATIONS

This application claims priority from and the benefit under 35 U.S.C. § 119 (a) of Korean Patent Application No. 10-2015-0191104 filed on Dec. 31, 2015, which is hereby incorporated by reference for all purposes as if fully set forth herein.

BACKGROUND OF THE INVENTION

Field of the Invention

The embodiments of the present disclosure relate to an organic light emitting display panel and an organic light emitting diode display device including the same. More particularly, the embodiments of the present disclosure relate to an organic light emitting display panel having a broadened aperture unit and an organic light emitting diode display device including the same.

Description of the Related Art

With progression to an information-oriented society, various demands for display devices for displaying an image are increasing. Recently, various kinds of flat panel display devices such as a liquid crystal display device (LCD), a plasma display panel device (PDP), and an organic light emitting diode display device (OLED) have been used.

Among the above display devices, the organic light emitting diode display device uses a self-light emitting element. Therefore, the organic light emitting diode display device does not need a back light which is used for a liquid crystal display device using a non-emitting element. Therefore, the organic light emitting diode display device can be manufactured in a lightweight and thin form. Further, the organic light emitting diode display device has a wide viewing angle and a high contrast ratio as compared with the liquid crystal display device. The organic light emitting diode display device is also advantageous in terms of power consumption. Furthermore, the organic light emitting diode display device is driven at a low DC voltage and has a high response speed. An internal component of the organic light emitting diode display device is solid so that the organic light emitting diode display device is strong against an external impact and has a high working temperature range. Further, the organic light emitting diode display device may be manufactured at a lower cost.

The above organic light emitting diode display device displays an image in accordance with a top emission method or a bottom emission method depending on a structure of the organic light emitting diode including a first electrode, a second electrode, and an organic light emitting layer. According to the bottom emission method, a visible ray generated from the organic light emitting layer is displayed below a substrate on which TFTs are formed. In contrast, according to the upper emission method, a visible ray generated from the organic light emitting layer is displayed above the substrate on which TFTs are formed.

In the meantime, with regard to an active organic field emitting element whose size is being increased, it is very important to secure a maximum aperture ratio and maintain a luminance. However, the aperture ratio is reduced and the luminance is lowered due to various wiring lines and transistors of the organic field emitting element. Therefore, an organic light emitting diode display device which may solve the above-mentioned problem is being demanded.

SUMMARY OF THE INVENTION

According to an aspect of the invention, an organic light emitting display panel includes: a data line and a first scan line disposed to intersect each other; a plurality of sub-pixels; a second scan line; a driving voltage line and a reference voltage line; and a plurality of active layers for the plurality of sub-pixels, wherein at least one active layer of at least one sub-pixel among the plurality of sub-pixels overlaps any one of the data line, the driving voltage line, and the reference voltage line, and also overlaps the first or second scan line. Accordingly, a circuit area is reduced and an aperture unit is broadened. Therefore, luminance of a large-size organic light emitting diode display device and a lifespan of an organic light emitting diode may extend.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
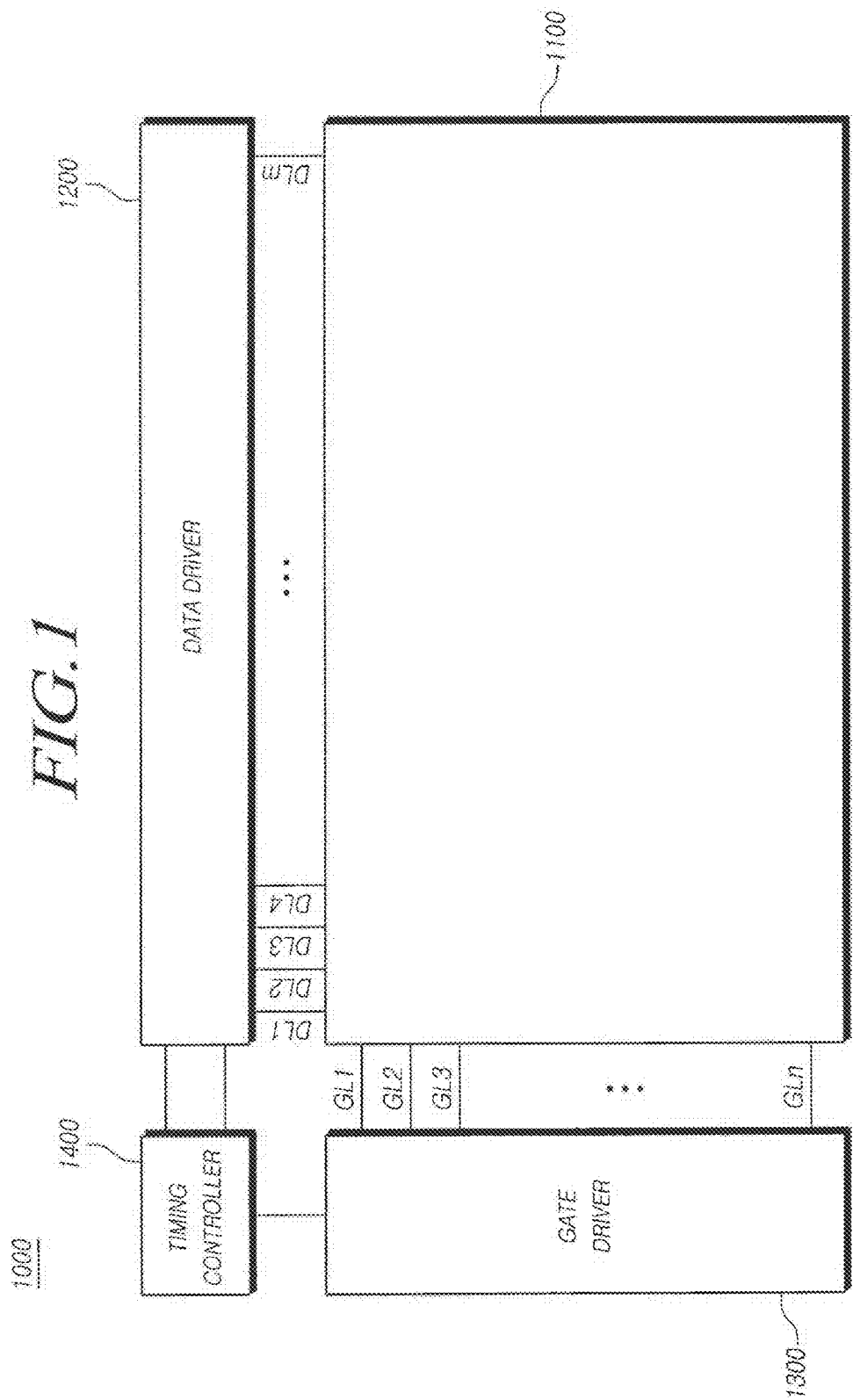
FIG. 1 is a schematic system configuration view of an organic light emitting diode display device according to the present example embodiments.

Hereinafter, example embodiments of the present disclosure will be described in detail with reference of the accompanying drawings. The following example embodiments are provided for sufficiently conveying the concept of the present disclosure to those skilled in the art. Therefore, the present disclosure is not limited to the following example embodiments themselves but can be modified and changed in other embodiments. Further, in the drawings, the size and thickness of a device may be exaggerated for convenience. Like reference numerals generally denote like elements throughout the present specification.

Advantages and features of the present disclosure, and methods for accomplishing the same will be more clearly understood from example embodiments described below with reference to the accompanying drawings. However, the present disclosure is not limited to the following example embodiments but may be implemented in various different forms. The example embodiments are provided only to complete disclosure of the present disclosure and to fully provide a person having ordinary skill in the art to which the present disclosure pertains with the category of the invention, and the present disclosure will be defined by the appended claims. Like reference numerals generally denote like elements throughout the present specification. In the drawings, the sizes and relative sizes of layers and regions may be exaggerated for clarity.

When an element or layer is referred to as being "on" another element or layer, it may be directly on the other element or layer, or intervening elements or layers may be present. Meanwhile, when an element is referred to as being "directly on" another element, any intervening elements may not be present.

The spatially-relative terms such as "below", "beneath", "lower", "above", and "upper" may be used herein for ease of description to describe the relationship of one element or components with another element(s) or component(s) as illustrated in the drawings. It will be understood that the spatially relative terms are intended to encompass different orientations of the element in use or operation, in addition to the orientation depicted in the drawings. For example, if the element in the drawings is turned over, elements described as "below" or "beneath" other elements would then be oriented "above" the other elements. Thus, the example term "below" can encompass both an orientation of above and below.

Further, in describing components of the present invention, terms such as first, second, A, B, (a), and (b) can be used. These terms are used only to differentiate the components from other components. Therefore, the nature, order, sequence, and the like, of the corresponding components are not limited by these terms.

FIG. 1 is a schematic system configuration view of an organic light emitting diode display device according to the present example embodiments. Referring to FIG. 1, an organic light emitting diode display device 1000 according to the present example embodiments includes an organic light emitting display panel 1100 in which a plurality of data lines DL to DLm and a plurality of gate lines GL1 to GLn are disposed and a plurality of sub-pixels is disposed, a data driver 1200 configured to drive the plurality of data lines DL to DLm, a gate driver 1300 configured to drive the plurality of gate lines GL1 to GLn, and a timing controller 1400 configured to control the data driver 1200 and the gate driver 1300. In the meantime, in the present example embodiments, terms of a data line and a scan line are not specifically distinguished.

The data driver 1200 drives the plurality of data lines by supplying a data voltage to the plurality of data lines. Further, the gate driver 1300 sequentially drives the plurality of gate lines by sequentially supplying a scan signal to the plurality of gate lines.

Furthermore, the timing controller 1400 controls the data driver 1200 and the gate driver 1300 by supplying a control signal to the data driver 1200 and the gate driver 1300. The timing controller 1400 starts scanning according to a timing implemented in each frame, converts input image data input from the outside to be suitable for a data signal form used by the data driver 1200 to output the converted image data. The timing controller 1400 controls data driving at a proper time corresponding to the scanning.

The gate driver 1300 sequentially drives the plurality of gate lines by sequentially supplying an ON voltage or OFF voltage scan signal to the plurality of gate lines according to the control of the timing controller 1400. Further, the gate driver 1300 may be located at only one side of the organic light emitting display panel 1100 as illustrated in FIG. 1 or may be located at both sides thereof if necessary or desired, according to a driving method or a design method of the organic light emitting display panel.

Further, the gate driver 1300 may include one or more gate driver integrated circuits. Each of the gate driver integrated circuits may be connected to a bonding pad of the organic light emitting display panel 1100 through a Tape Automated Bonding (TAB) method or a Chip On Glass (COG) method. Each of the gate driver integrated circuits may also be implemented in a Gate In Panel (GIP) type to be directly disposed in the organic light emitting display panel 1100, or may be integrated and disposed in the organic light emitting display panel 1100 if necessary or desired.

Further, each of the gate driver integrated circuits may be implemented in a chip on film (COF) type. In this instance, a gate driving chip corresponding to each gate driver integrated circuit may be mounted on a flexible film, and one end of the flexible film may be bonded to the organic light emitting display panel 1100.

If a specific gate line is opened, the data driver 1200 converts image data received from the timing controller 1400 into a data voltage of an analog form and supplies the data voltage to the plurality of data lines to drive the plurality of data lines. Further, the data driver 1200 may include at least one source driver integrated circuit to drive the plurality of data lines.

Each of the source driver integrated circuits may be connected to a bonding pad of the organic light emitting display panel 1100 through a Tape Automated Bonding (TAB) method or a Chip On Glass (COG) method. Each of the source driver integrated circuits may also be directly disposed in the organic light emitting display panel 1100, or may be integrated and disposed in the organic light emitting display panel 1100 if necessary or desired.

Further, each of the source driver integrated circuits may be implemented in a chip on film (COF) type. In this instance, a source driving chip corresponding to each source driver integrated circuit is mounted on a flexible film. One end of the flexible film is bonded to at least one source printed circuit board and the other end thereof is bonded to the organic light emitting display panel 1100.

The source printed circuit board is connected to a control printed circuit board through a connecting medium such as a flexible flat cable (FFC) or a flexible printed circuit (FPC). The timing controller 1400 is disposed in the control printed circuit board.

Further, in the control printed circuit board, a power controller configured to supply a voltage or current to the organic light emitting display panel 1100, the data driver 1200, the gate driver 1300, and the like, or control a voltage or current to be supplied may be further disposed. The above-described source printed circuit board and control printed circuit board may be formed as one printed circuit board.

In the meantime, a pixel of the present example embodiments includes one or more sub-pixels. For example, the pixel of the present example embodiments may include two to four sub-pixels. Even though colors defined in the sub-pixel may include red R, green G, and blue B, and selectively include white W, the present example embodiments are not limited thereto. A configuration in which one pixel of the organic light emitting diode display device 1000 according to example embodiments, which will be described below, includes at least one white (W) sub-pixel will be mainly described.

Further, the organic light emitting diode according to the present example embodiments includes a first electrode, an organic light emitting layer, and a second electrode. The organic light emitting layer may include all configurations which are disposed in every sub-pixel or disposed on an entire surface of a lower substrate.

In this instance, an electrode which is connected to a thin film transistor configured to control emission of each sub-pixel of the organic light emitting display panel 1100 is referred to as a first electrode. An electrode which is disposed on an entire surface of the display panel or is disposed to include two or more pixels is referred to as a second electrode. When the first electrode is an anode, the second electrode is a cathode. In contrast, when the first electrode is a cathode, the second electrode is an anode. Hereinafter, it is described that the anode is an example embodiment of the first electrode and the cathode is an example embodiment of the second electrode, but the present disclosure is not limited thereto.

In the meantime, each sub-pixel further includes a driving voltage line and a reference voltage line which are disposed to be parallel to the data lines DL to DLm. Further, the plurality of transistors which is disposed in each sub-pixel may include source/drain electrodes which are branched from the data line, the driving voltage line or the reference voltage line.

However, when the source/drain electrode is branched from the data line, the driving voltage line or the reference voltage line to form the plurality of transistors, the circuit area is broadened as large as the branched area. Therefore, an emission area is reduced so that an aperture ratio of each sub-pixel is lowered. Further, when the circuit area is reduced to improve the aperture ratio of each sub-pixel, sizes of components which configure the circuit area are also reduced, which may lower reliability.

The present example embodiments are provided to solve the above-mentioned problems. To this end, an active layer of at least one transistor, among a plurality of transistors which is provided in each sub-pixel, overlaps a data line, a driving voltage line, or a reference voltage line. Therefore, the transistor is formed without having the source/drain electrode which is branched from the data line, the driving voltage line, or the reference voltage line. As a result, the organic light emitting diode display device in which the circuit area is reduced and the emission area is broadened is provided.

Hereinafter, the present example embodiments will be described in detail with reference to the drawings.

Figure 2:
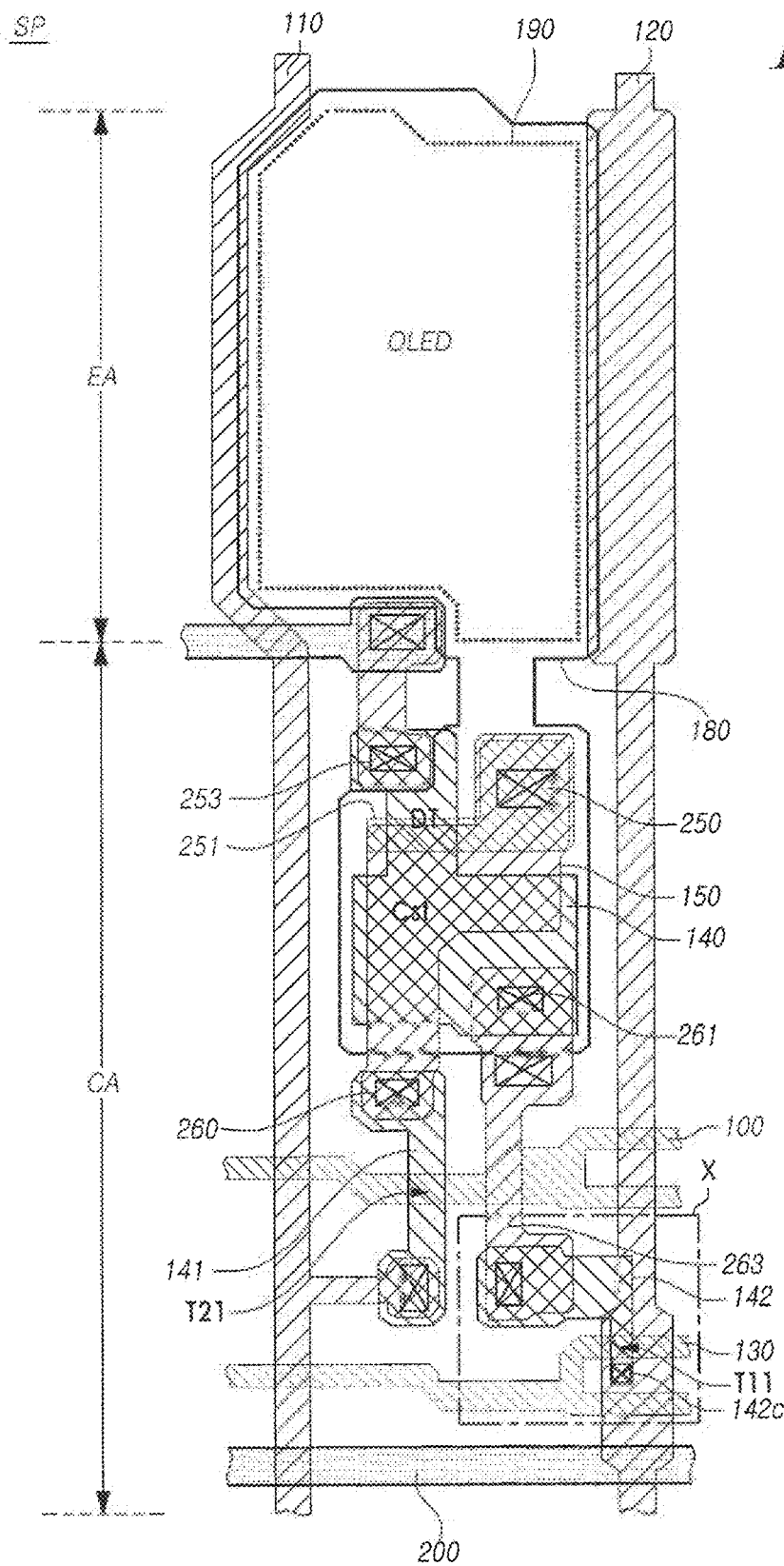
FIG. 2 is a plane view illustrating one sub-pixel included in an organic light emitting diode display device according to a first example embodiment.

FIG. 2 is a plane view illustrating one sub-pixel included in an organic light emitting diode display device according to a first example embodiment. Referring to FIG. 2, one sub-pixel SP included in an organic light emitting diode display device according to a first example embodiment is configured by an emission area EA and a circuit area CA.

The circuit area CA of one sub-pixel SP includes a plurality of transistors T11, T21, and DT and an organic light emitting diode OLED. For example, the circuit area CA may include three transistors T11, T21, and DT. More specifically, the circuit area CA may include a first transistor T11, a second transistor T21, and a driving transistor DT.

Further, a plurality of lines 100, 110, 120, 130, and 200 may be disposed in one sub-pixel SP. Specifically, one sub-pixel may include a first line 100, a second line 110, a third line 120, a fourth line 130, and a fifth line 200.

Here, the first line 100 and the fourth line 130 may be spaced apart from each other to be parallel in a first direction (a horizontal direction in FIG. 2). Here, the first line 100 may be a first scan line, that is, a data line and the fourth line 130 may be a second scan line, that is, a sensing line. However, the organic light emitting diode display device according to the first example embodiment is not limited thereto.

Further, the second line 110 and the third line 120 may be spaced apart from each other to be parallel in a second direction (a vertical direction in FIG. 2). Here, the second line 110 may be a data line Vdata and the third line 120 may be a reference voltage line Vref. However, the organic light emitting diode display device according to the first example embodiment is not limited thereto. Further, the fifth line 200 may be a connection line which is connected to the reference voltage line, but the organic light emitting diode display device according to the first example embodiment is not limited thereto. For example, it is sufficient if the second line 110 and the third line 120 of the organic light emitting diode display device according to the first example embodiment are any one of the data line, the reference voltage line, and the driving voltage line.

In the meantime, the emission area EA of the sub-pixel SP may be defined by a bank pattern 190 which is disposed in a part of a top surface of a first electrode 180. In the emission area EA, the organic light emitting diode OLED including the first electrode 180, a second electrode, and one or more organic layers may be disposed. The organic light emitting diode OLED may emit light according to a current which is supplied from the driving transistor DT disposed on a substrate.

With regard to an electric connection relationship of the sub-pixel SP of the organic light emitting diode display device according to the first example embodiment, the first electrode 180 of the organic light emitting diode OLED is connected to one end of the driving transistor DT through a first contact hole 250. Here, the driving transistor DT may be configured by a gate electrode 251, an active layer 140, a drain electrode 253, and a source electrode 263. Here, the source electrode 263 may be a floating pattern which is connected to the first transistor T11.

Further, a storage capacitor Cst may be provided in a region where the active layer 140 of the driving transistor DT and a plate 150 overlap.

Further, the other end of the driving transistor DT may be connected to the second transistor T21 through a second contact hole 260. Here, the second transistor T21 may be a switching transistor. The second transistor T21 includes a gate electrode which is connected to the first line 100, an active layer 141, and a source/drain electrode.

Further, the first transistor T11 connected to the fourth line 130 may be a sensing transistor. The first transistor T11 may be configured by a gate electrode which is connected to the fourth line 130, an active layer 143, a floating pattern 263, and a drain electrode. In this instance, the floating pattern 263 may serve as a source electrode of the first transistor T11 and the drain electrode may be connected to the third line 120.

Further, one end of the first transistor T11 may be connected to the storage capacitor Cst through a third contact hole 261.

In the meantime, an electrical function of the organic light emitting diode (OLED) will be described. First, the switching transistor T2 is turned on by a scan signal supplied through the first line to transmit a data signal supplied through the data line 110 to the gate electrode 251 of the driving transistor DT. The storage capacitor Cst stores a data signal supplied through the switching transistor T2 to maintain a turned-on state of the driving transistor DT for a predetermined time or longer. Further, the driving transistor DT is driven in accordance with a data signal stored in the storage capacitor Cst. The driving transistor DT controls a driving current or a driving voltage supplied to the first electrode 180 in accordance with the data signal.

When the driving transistor DT is driven, a light emitting layer of an organic layer emits light by a current supplied through the driving transistor DT. The driving current supplied through the driving transistor DT is transmitted to the first electrode 180 and flows through the organic layer. By doing this, an electron and a hole are recoupled to emit light and the driving current finally flows out to the second electrode.

In the meantime, a part of the active layer 142 of the first transistor T11 according to the present example embodiment may overlap the third line 120 and the fourth line 130. In this instance, the third line 120 may be connected to the active layer 142 (a third active layer 142) through a fourth contact hole 142c.

As described above, in the organic light emitting diode display device according to the first example embodiment of the present disclosure, an active layer of at least one transistor, among a plurality of transistors disposed in at least one sub-pixel SP, overlaps the third line 120. Therefore, the transistor is formed without having a source/drain electrode branched from the third line 120, thereby reducing the circuit area and broadening the emission area.

In the meantime, in FIG. 2, even though it is illustrated that the reference voltage line 120 is disposed to be parallel to the data line 110, the one pixel may further include a driving voltage line which is disposed to be parallel to the data line 110. In this instance, the active layer of the at least one transistor disposed in one pixel may overlap any one of the data line 110, the reference voltage line 120, and the driving voltage line.

Further, in FIG. 2, even though it is illustrated that the active layer 142 of the first transistor T11 overlaps the third line 120, the organic light emitting diode display device according to the first example embodiment is not limited thereto. In the organic light emitting diode display device, it is sufficient if an active layer of at least one transistor, among the first transistor T11, the second transistor T21, and the driving transistor DT, is configured to overlap the second line 110 or the third line 120.

Figure 3:
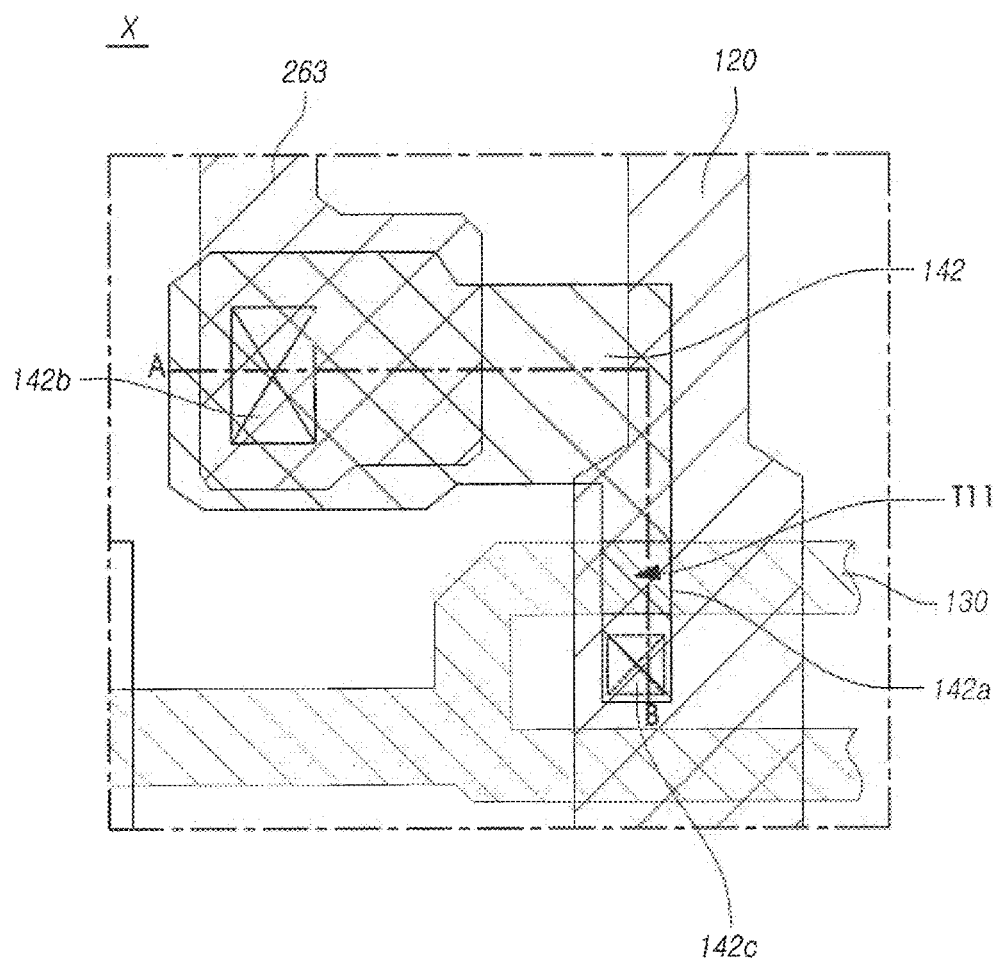
FIG. 3 is an enlarged view of a region X of FIG. 2.

The configuration will be described below in detail with reference to FIG. 3. FIG. 3 is an enlarged view of a region X of FIG. 2. Referring to FIG. 3, a third active layer 142 of the first transistor which is disposed in the region X of FIG. 2, that is, the third active layer 142 of the sensing transistor may overlap the third line 120 and the fourth line 130.

Specifically, in at least one sub-pixel of the organic light emitting diode display device according to the first example embodiment, the active layer 142 of the sensing transistor may overlap the third line 120 and the fourth line 130. Further, the floating pattern 263 is connected to the third active layer 142 through a fifth contact hole 142b. Further, the third line 120 may be connected to the third active layer 142 through the fourth contact hole 142c.

Here, the fourth line 130 may serve as a gate electrode of the first transistor and the third line 120 may serve as a source electrode or a drain electrode of the first transistor. For example, when the floating pattern 263 is the source electrode of the first transistor, the third line 120 may be a drain electrode of the first transistor. When the floating pattern 263 is a drain electrode of the first transistor, the third electrode 120 may be a source electrode.

In the meantime, in the area where the active layer 142 overlaps the fourth line 130 and the third line 120, the active layer 142 may include a channel region 142a. The configuration will be described below in detail with reference to FIG. 4.

Figure 4:
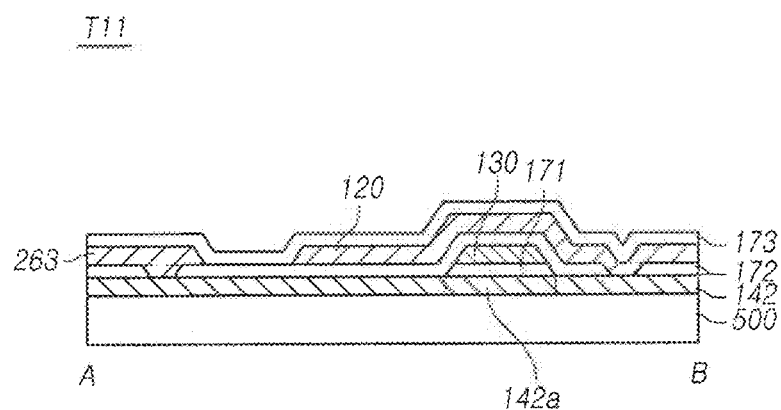
FIG. 4 is a cross-sectional view taken along a line A-B of FIG. 3.

FIG. 4 is a cross-sectional view taken along a line A-B of FIG. 3. Referring to FIG. 4, in the first transistor T11 according to the first example embodiment, the active layer 142 is disposed on a substrate 500 and a gate insulating layer 171 is disposed on a part of the top surface of the active layer 142. The fourth line 130 is disposed on the gate insulating layer 171.

Here, the gate insulating layer 171 and the fourth line 130 may be disposed in a position corresponding to the channel region 142a of the active layer 142 of the first transistor T11. Further, the fourth line 130 may serve as a gate electrode of the first transistor T11.

An interlayer insulating layer 172 is disposed on the fourth line 130. Further, the floating pattern 263 and the third line 120 are disposed on the interlayer insulating layer 172. Here, the floating pattern 263 and the third line 120 may be connected to the active layer 142 through a contact hole formed in the interlayer insulating layer 172.

Here, the floating pattern 263 may serve as a source electrode of the first transistor T11 and the third line 120 may serve as a drain electrode of the first transistor T11. However, the present example embodiment is not limited thereto and the floating pattern 263 may serve as the drain electrode of the first transistor T11 and the third line 120 may serve as the source electrode of the first transistor T11. Further, a protective layer 173 may be disposed on the floating pattern 263 and the third line 120.

Here, the active layer 142 of the first transistor T11 may be formed of a transparent conductive material. For example, the active layer 142 of the first transistor T11 may be formed of a compound including indium tin oxide (ITO), indium zinc oxide (IZO), indium gallium oxide (IGO), indium gallium zinc oxide (IGZO), or a combination thereof. However, a material of the active layer 142 of the first transistor T11 according to the present example embodiment is not limited thereto. In the meantime, the active layer 142 may include a source region, a drain region, and a channel region. A conducting property is imparted to the source region and the drain region of the active layer 142 for contact efficiency with the source electrode and the drain electrode, respectively. Specifically, the channel region of the active layer 142 overlapping the fourth line 130 which serves as a gate electrode is a semiconductor. However, a conducting property is imparted to the source region and the drain region where the active layer 142 is in contact with the third line 120 which serves as a source electrode and the floating pattern 263 which serves as a drain electrode.

As described above, the fourth line 130 is disposed on the active layer 142 of the first transistor T11 and the third line 120 is disposed on the fourth line 130. In this instance, the channel region 142a of the active layer 142 of the first transistor T11 may overlap the third line 120 and the fourth line 130. That is, the first transistor T11 may be configured to share the third line 120, that is, the reference voltage line.

As described above, the active layer 142 which configures the first transistor T11 is disposed below the fourth line 130 and the third line 120, so that the configuration of the source/drain electrode of the first transistor T11 does not need to be branched from the third line 120. In other words, since the third line 120 serves as the source/drain electrode of the first transistor T11, the configuration of the source/drain electrode of the first transistor T11 does not need to be branched from the third line 120. Therefore, an area is reduced as large as the configuration of the source/drain electrode which is not branched from the third line 120 so that the circuit area may be reduced.

Further, the active layer 142 of the first transistor T11 is not disposed on the same layer as the third line 120. Therefore, even though the active layer 142 of the first transistor T11 overlaps the third line 120, a separate space for the active layer 142 is not necessary.

Figure 5:
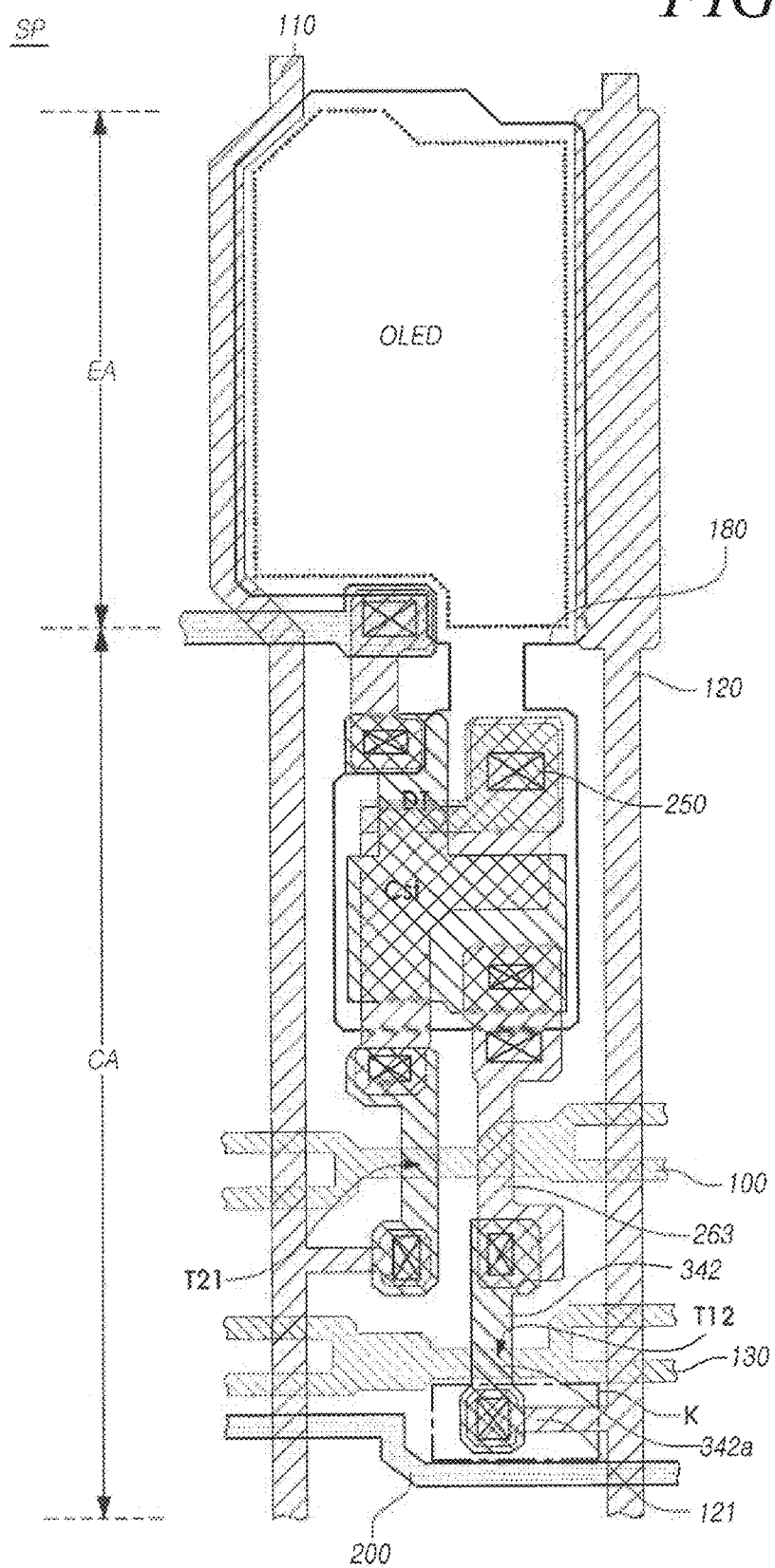
FIG. 5 is a plane view illustrating one sub-pixel of an organic light emitting diode display device according to a comparative embodiment.

Next, the organic light emitting diode display device according to the first example embodiment will be compared with an organic light emitting diode display device according to a comparative embodiment below. FIG. 5 is a plane view illustrating one sub-pixel of an organic light emitting diode display device according to a comparative embodiment. The first transistor according to the comparative embodiment may include the same components as those of the first transistor according to the first example embodiment. The redundant description thereof will be omitted herein. Further, like reference numerals denote like components.

Referring to FIG. 5, in the organic light emitting diode display device according to the comparative embodiment, a structure of a first transistor T12 which may be a sensing transistor may be different from the structure of the first transistor of the organic light emitting diode display device according to the first example embodiment.

Specifically, the first transistor T12 according to the comparative embodiment may be configured by a fourth line 130, an active layer 342, a floating pattern 263, and a drain electrode 121. Here, the fourth line 130 may serve as a gate electrode of the first transistor T12 and the floating pattern 263 may serve as a source electrode of the first transistor T12.

In the meantime, a channel region 342a of the active layer 342 of the first transistor T12 according to the comparative embodiment may overlap the fourth line 130. The drain electrode 121 of the first transistor T12 according to the comparative embodiment may be branched from the third line 120. The first transistor T12 is connected to a fifth line 200 through a second floating line 211, which is different from the first transistor T11 according to the first example embodiment.

Here, since the drain electrode 121 of the first transistor T12 according to the comparative embodiment is branched from the third line 120, the circuit area may be broadened as large as an area K where the drain electrode 121 is branched. However, in this instance, the aperture ratio is lowered as much as the branched area K of the drain electrode 121.

In the meantime, in the first transistor according to the first example embodiment, the active layer overlaps the third line 120. Therefore, the third line 120 is in structurally contact with the active layer and thus the third line 120 serves as the drain electrode of the first transistor. That is, a structure which serves as the drain electrode does not need to be branched from the third line 120. Therefore, as compared with the comparative embodiment, the circuit area of the organic light emitting diode display device according to the first example embodiment is reduced as large as the area K of FIG. 5. Further, the aperture ratio is correspondingly increased.

Figure 6:
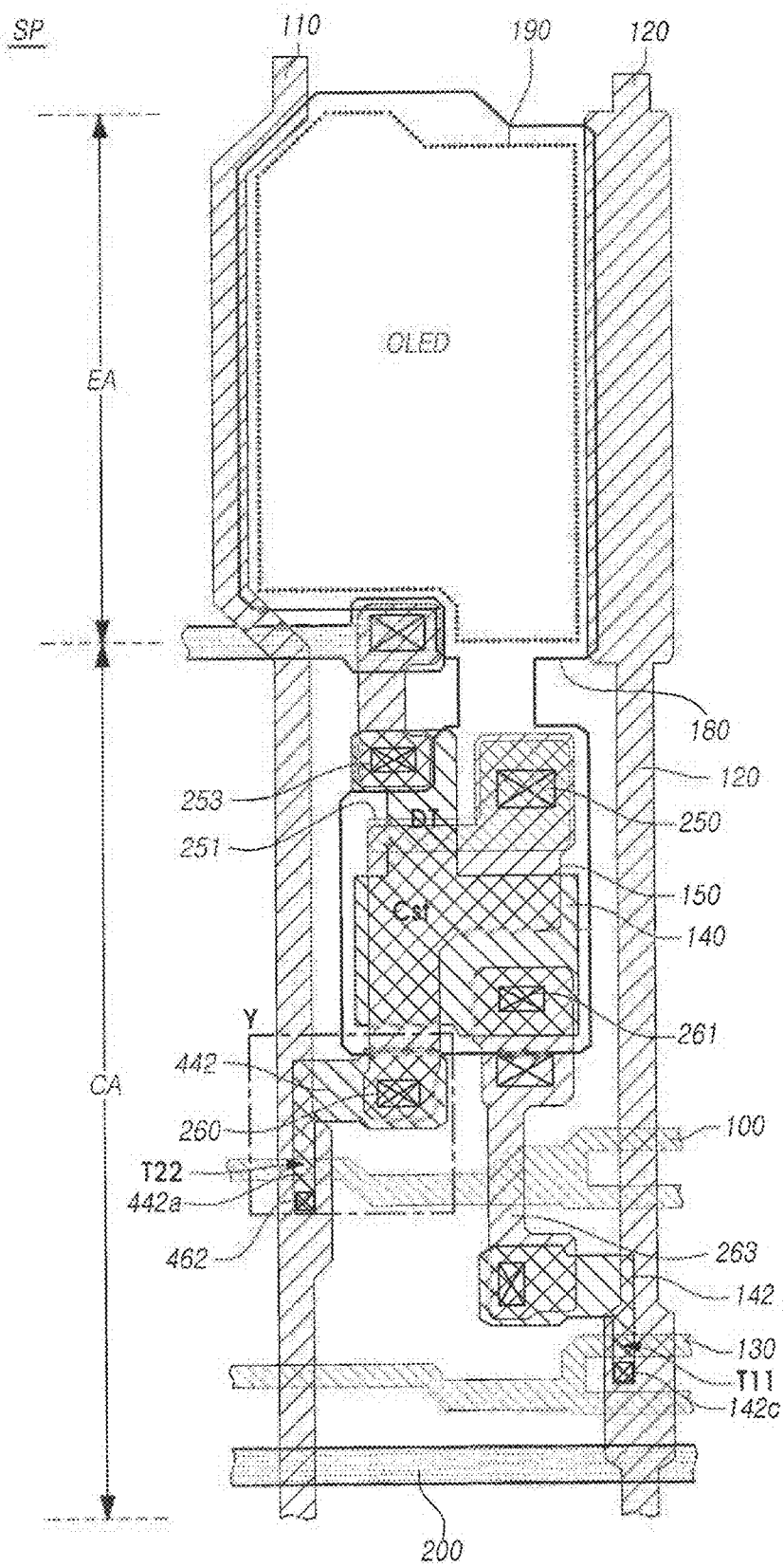
FIG. 6 is a plane view illustrating one sub-pixel included in an organic light emitting diode display device according to a second example embodiment.

Next, an organic light emitting diode display device according to a second example embodiment will be described below with reference to FIGS. 6 to 9. FIG. 6 is a plane view illustrating one sub-pixel included in an organic light emitting diode display device according to the second example embodiment. The organic light emitting diode display device according to the second example embodiment may include the same components as those of the above-described example embodiment. The redundant description thereof will be omitted. Further, like reference numerals denote like components.

Referring to FIG. 6, a circuit area CA of one sub-pixel SP of the organic light emitting diode display device according to the second example embodiment includes a plurality of transistors T11, T22, and DT and an organic light emitting diode OLED. For example, the circuit area CA may include three transistors T11, T22, and DT. Specifically, the circuit area CA may include a first transistor T11, a second transistor T22, and a driving transistor DT.

Further, a plurality of lines 100, 110, 120, 130, and 200 may be disposed in one sub-pixel SP. Specifically, one sub-pixel may include a first line 100, a second line 110, a third line 120, a fourth line 130, and a fifth line 200.

Here, the first line 100 may be a first scan line, the second line 110 may be a data line, the third line 120 may be a reference voltage line, the fourth line 130 may be a second scan line, and the fifth line 200 may be a connection line which is connected to the reference voltage line. However, the organic light emitting diode display device according to the second example embodiment is not limited thereto. For example, it is sufficient if the second line 110 and the third line 120 of the organic light emitting diode display device according to the second example embodiment are any one of the data line, the reference voltage line, and the driving voltage line.

In the meantime, the first transistor T11 according to the second example embodiment may be configured by a gate electrode which is connected to the fourth line 130, an active layer 143, a floating pattern 263, and a drain electrode. In this instance, the floating pattern 263 may serve as a source electrode of the first transistor T11 and the third drain electrode may be connected to the third line 120.

Further, a part of the active layer 142 of the first transistor T11 may overlap the third line 120 and the fourth line 130. In this instance, the third line 120 may be connected to the third active layer 142 of the first transistor T11 through a contact hole 262 through which the active layer 142 of the first transistor T11 is exposed.

Further, the second transistor T22 according to the second example embodiment may be configured by a gate electrode which is connected to the first line 100, an active layer 442, a plate 150 which serves as a source electrode and a drain electrode. In this instance, the second line 110 may serve as a source electrode of the second transistor T22.

Further, a part of the active layer 442 of the second transistor T22 may overlap the first line 100 and the second line 110. In this instance, the second line 110 and the plate 150 may be connected to the active layer 442 of the second transistor T22 through contact holes 260 and 462 through which the active layer 442 of the second transistor T22 is exposed, respectively.

As described above, in the organic light emitting diode display device according to the second example embodiment, each of active layers of two transistors, among a plurality of transistors disposed in at least one sub-pixel SP, overlaps the second line 110 or the third line 120. Therefore, the transistor is formed without having a source/drain electrode branched from the second line 110 or the third line 120, so that the circuit area is reduced and the emission area is broadened.

In the meantime, in FIG. 6, it is illustrated that the active layers 142 and 442 of the first transistor T11 and the second transistor T22 overlap the third line 120 and the second line 110, respectively. However, in the organic light emitting diode display device according to the second example embodiment, it is sufficient if active layers of at least two transistors among the first transistor T11, the second transistor T22, and the driving transistor DT are configured to overlap the second line 110 or the third line 120.

Figure 7:
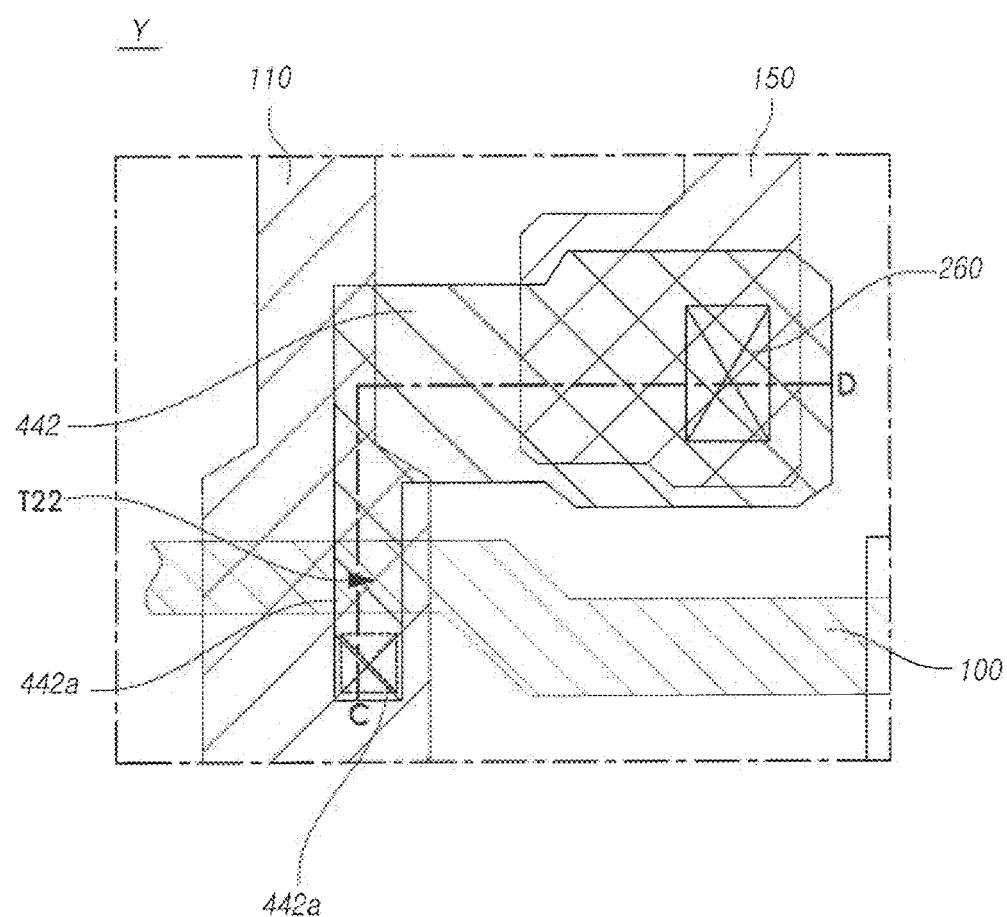
FIG. 7 is an enlarged view of a region Y of FIG. 6.

The configuration will be described below in detail with reference to FIG. 7. FIG. 7 is an enlarged view of a region Y of FIG. 6. Referring to FIG. 7, the active layer 442 of a second transistor which is disposed in the region Y of FIG. 6, that is, the active layer of a switching transistor may overlap the first line 100 and the second line 110.

Specifically, in at least one sub-pixel of the organic light emitting diode display device according to the second example embodiment, the active layer 442 of the second transistor may overlap the first line 100 and the second line 110. Further, the plate 150 and the second line 110 may be connected to the active layer 442 of the second transistor through contact holes 260 and 360, respectively.

Here, the first line 100 may serve as a gate electrode of the second transistor and the second line 110 may serve as a source electrode of the second transistor. The plate 150 may serve as a drain electrode of the second transistor. However, a configuration of the second transistor according to the second example embodiment is not limited thereto. The second line 110 may serve as a drain electrode of the second transistor and the plate 150 may serve as a source electrode of the second transistor.

In the meantime, in the area where the active layer 442 of the second transistor overlaps the first line 100 and the second line 110, the active layer 442 of the second transistor may include a channel region 442*a*. The configuration will be described below with reference to FIG. 8.

Figure 8:
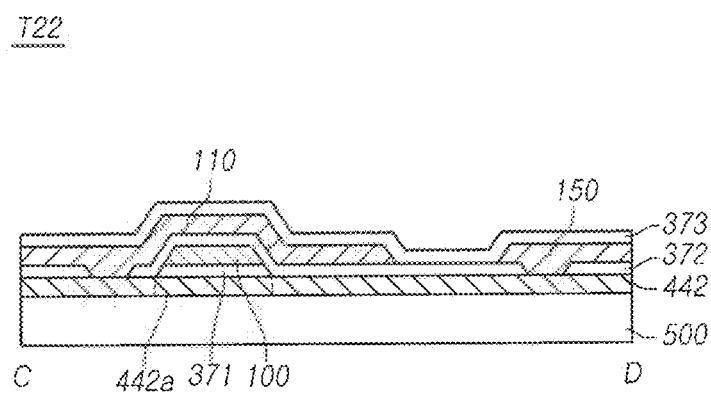
FIG. 8 is a cross-sectional view taken along a line C-D of FIG. 7.

FIG. 8 is a cross-sectional view taken along a line C-D of FIG. 7. Referring to FIG. 8, in the second transistor T22 according to the second example embodiment, the active layer 442 is disposed on a substrate 500 and a gate insulating layer 371 is disposed on a part of a top surface of the active layer 442. The first line 100 is disposed on the gate insulating layer 371.

Here, the gate insulating layer 371 and the first line 100 may be disposed in a position corresponding to the channel region 442*a* of the active layer 442 of the second transistor T22. Further, the first line 100 may serve as a gate electrode of the second transistor T22.

An interlayer insulating layer 372 is disposed on the first line 100. Further, the second line 110 and the plate 150 are disposed on the interlayer insulating layer 371. Here, the second line 110 and the plate 150 may be connected to the active layer 442 through a contact hole formed in the interlayer insulating layer 372.

Here, the second line 110 may serve as a source electrode of the second transistor T22 and the plate 150 may serve as a drain electrode of the second transistor T22. However, the present example embodiment is not limited thereto. Further, a protective layer 373 may be disposed on the second line 110 and the plate 150.

Here, the active layer 442 of the second transistor T22 may be formed of a compound including indium tin oxide (ITO), indium zinc oxide (IZO), indium gallium oxide (IGO), indium gallium zinc oxide (IGZO), or a combination thereof, but a material of the active layer 442 of the second transistor T22 according to the present example embodiment is not limited thereto. In the meantime, the active layer 442 may include a source region, a drain region, and a channel region. A conducting property is imparted to the source region and the drain region of the active layer 442 for contact efficiency with the source electrode and the drain electrode, respectively. Specifically, the channel region of the active layer 442 overlapping the first line 100 which serves as a gate electrode is a semiconductor. However, a conducting property is imparted to the source region and the drain region where the active layer 442 is in contact with the second line 110 which serves as a source electrode and the plate 150 which serves as a drain electrode.

As described above, the first line 100 is disposed on the active layer 442 of the second transistor T22 and the second line 110 is disposed on the first line 100. In this instance, the channel region 442*a* of the active layer 442 of the second transistor T22 may overlap the first line 100 and the second line 110.

As described above, the active layer 442 which configures the second transistor T22 is disposed below the first line 100 and the second line 110, so that the configuration of the source/drain electrode of the second transistor T22 does not need to be branched from the second line 110. In other words, since the second line 110 serves as the source/drain electrode of the second transistor T22, the configuration of the source/drain electrode of the second transistor T22 does not need to be branched from the second line 110. Therefore, an area is reduced as large as the configuration of the source/drain electrode which is not branched from the second line 110 so that the circuit area may be reduced.

Further, the active layer 442 of the second transistor T22 is not disposed on the same layer as the second line 110. Therefore, even though the active layer 442 of the second transistor T22 overlaps the second line 110, a separate space for the active layer 442 is not necessary.

Figure 9:
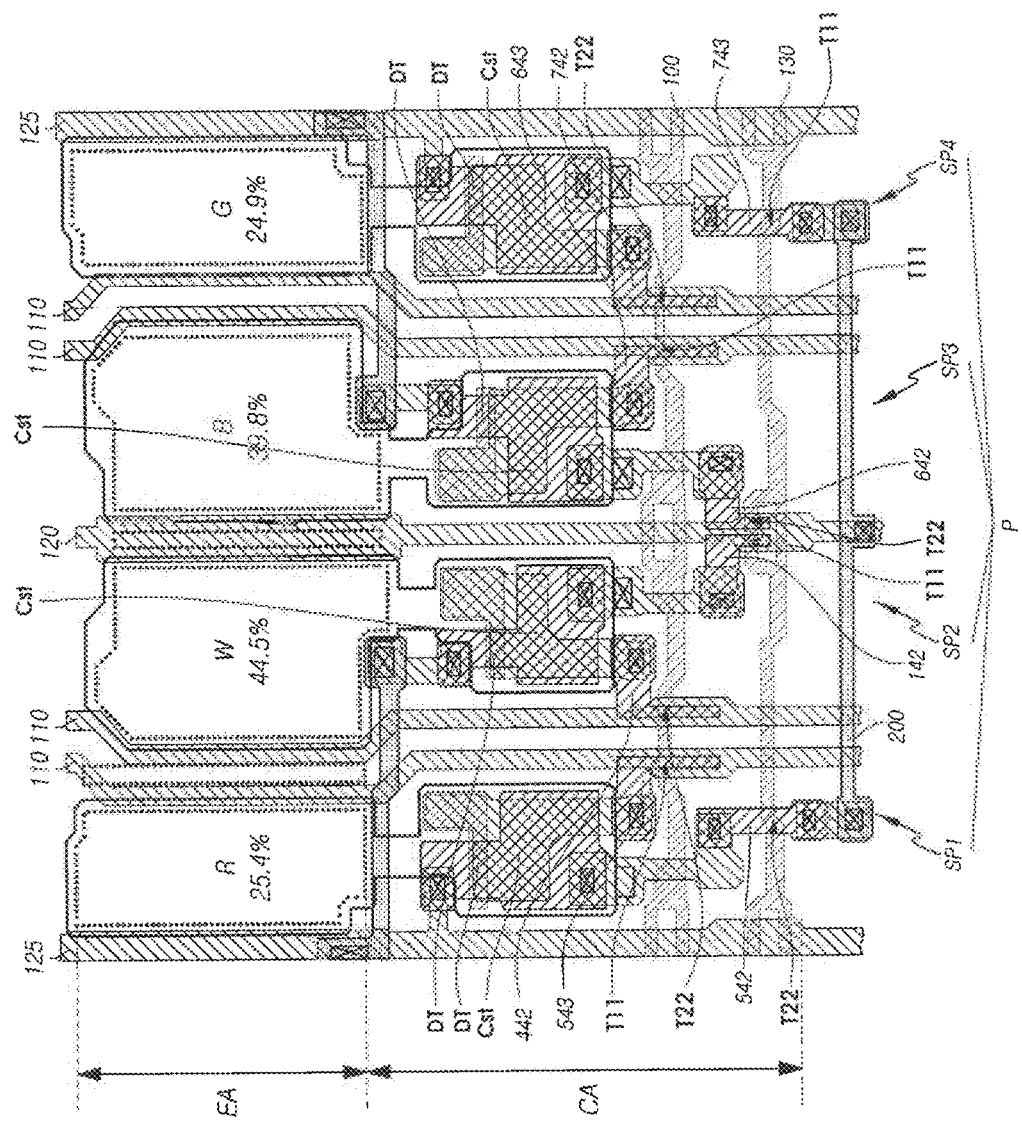
FIG. 9 is a plane view illustrating one pixel of an organic light emitting diode display device according to the present example embodiment.

Next, a structure of each pixel when the sub-pixel according to the present example embodiment is applied to one pixel of the organic light emitting diode display device will be described below. FIG. 9 is a plane view illustrating one pixel of an organic light emitting diode display device according to the present example embodiment. The organic light emitting diode display device illustrated in FIG. 9 may include the same components as those of the above-described example embodiment. The redundant description thereof will be omitted. Further, like reference numerals denote like components.

Referring to FIG. 9, one pixel P of the organic light emitting diode display device according to this example embodiment includes four sub-pixels SP1, SP2, SP3, and SP4. Specifically, the one pixel of the organic light emitting diode display device according to the present example embodiment may include a first sub-pixel SP1, a second sub-pixel SP2, a third sub-pixel SP3, and a fourth sub-pixel SP4. Each pixel may emit light with any one of red R, white W, blue B, and green G. In the meantime, FIG. 9 is an example of the one pixel P of the organic light emitting diode display device according to the present example embodiment and the one pixel P is not limited to include four sub-pixels SP1, SP2, SP3, and SP4.

Each of the sub-pixels SP1, SP2, SP3, and SP4 included in one pixel P may include a first transistor T11, a second transistor T22, and a driving transistor DT. In this instance, an active layer of at least one transistor among the first transistor T11, the second transistor T22, and the driving transistor DT which are disposed in each of the sub-pixels SP1, SP2, SP3, and SP4, specifically, a channel region of each active layer may overlap any one of the data line 110, the reference voltage line 120, and the driving voltage line 125 and also overlap any one of a first scan line 100 and a second scan line 130.

For example, in the first sub-pixel SP1, a channel region of an active layer 543 of the second transistor T22 may overlap the first scan line 100 and the data line 110.

Further, in the second sub-pixel SP2, a channel region of an active layer 142 of the first transistor T11 may overlap the second scan line 130 and the reference voltage line 120 and an active layer 442 of the second transistor T22 may overlap the first scan line 100 and the data line 110.

Further, in the third sub-pixel SP3, an active layer 643 of the second transistor T22 may overlap the first scan line 100 and the data line 110 and an active layer 642 of the first transistor T11 may overlap the second scan line 130 and the reference voltage line 120.

Furthermore, in the fourth sub-pixel SP4, an active layer 742 of the second transistor T22 may overlap the first scan line 100 and the data line 110.

That is, the active layers 543, 442, 643, and 742 which overlap the first scan line 100 overlap the data line 110, respectively, and the active layers 142 and 642 which overlap the second scan line 130 may overlap the reference voltage line 120. As described above, each active layer overlaps the data line 110, the driving voltage line 125, or the reference voltage line 120. The data line 110, the driving voltage line 125, or the reference voltage line 120 serves as a source/drain electrode so that a separate configuration of the source/drain electrode does not need to be provided. Therefore, a size of the circuit area may be reduced.

Figure 10:
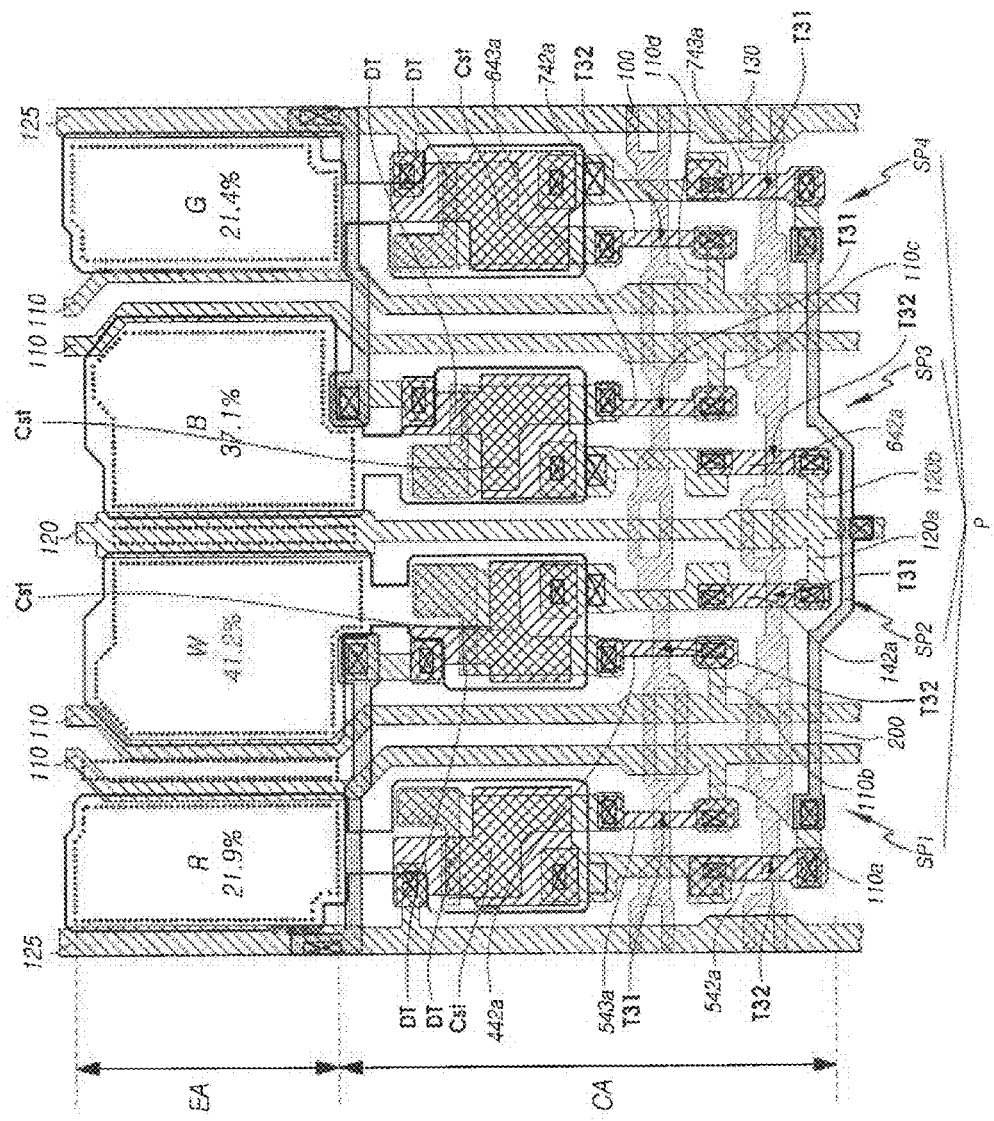
FIG. 10 is a plane view illustrating one pixel of an organic light emitting diode display device according to a comparative embodiment.

The above-mentioned effect will be described below while comparing FIGS. 9 and 10. FIG. 10 is a plane view illustrating one sub-pixel of an organic light emitting diode display device according to the comparative embodiment. One pixel according to the comparative embodiment may include the same components as those of one pixel illustrated in FIG. 9. Redundant description thereof will be omitted. Further, like reference numerals denote like components.

Referring to FIG. 10, each of sub-pixels SP21, SP22, SP23, SP24 included in one pixel P of an organic light emitting diode display device according to a comparative embodiment includes an emission area EA and a circuit area CA. Further, each of the sub-pixels SP21, SP22, SP23, and SP24 included in one pixel P may include a first transistor T31, a second transistor T32, and a driving transistor DT. In the meantime, in the first sub-pixel SP1 of FIG. 9, the channel region of the active layer 543 of the first transistor T11 overlaps the data line 110. In contrast, the channel region of an active layer 543a of the first transistor T31 of the first sub-pixel SP21 of FIG. 10 overlaps a pattern 110a branched from the data line 110.

In the second sub-pixel SP2 of FIG. 9, a channel region of an active layer 142 of the first transistor T11 and a channel region of an active layer 442 of the second transistor T22 may overlap the reference voltage line 120 and the data line 110, respectively. In contrast, in the second sub-pixel SP22 of FIG. 10, a channel region of an active layer 142a of the first transistor T31 and a channel region of an active layer 442a of the second transistor T32 may overlap a pattern 120a branched from the reference voltage line 120 and a pattern 110b branched from the data line 110, respectively.

Further, in the third sub-pixel SP3 of FIG. 9, a channel region of an active layer 643 of the first transistor T11 and a channel region of an active layer 642 of the second transistor T22 may overlap the data line 110 and the reference voltage line 120, respectively. In contrast, in the third sub-pixel SP23 of FIG. 10, the channel region of the active layer 642a of the first transistor T31 and the channel region of the active layer 642a of the second transistor T32 may overlap a pattern 110c branched from the data line 110 and a pattern 120b branched from the reference voltage line 120, respectively.

Further, in the fourth sub-pixel SP4 of FIG. 9, the channel region of the active layer 742 of the second transistor T22 overlaps the data line 100. In contrast, the channel region of an active layer 742a of the second transistor T32 of the fourth sub-pixel SP24 of FIG. 10 overlaps a pattern 110d branched from the data line 100.

As described above, a part of the active layer of a transistor of an organic light emitting diode display device according to an example embodiment illustrated in FIG. 9 overlaps a metal wiring line. Therefore, a size of the circuit area CA may be reduced as compared with the organic light emitting diode display device according to the comparative embodiment illustrated in FIG. 10. In this instance, a size of the emission area EA may be broadened as large as the reduced size of the circuit area CA. Therefore, an aperture ratio may be improved.

Specifically, it is understood that the aperture ratio of each sub-pixel according to the example embodiment may be improved as compared with the aperture ratio of each sub-pixel according to the comparative embodiment. More specifically, aperture ratios of the first to fourth sub-pixels SP1, SP2, SP3, and SP4 according to the example embodiment are 25.4%, 44.5%, 39.8%, and 24.9%, respectively. Further, aperture ratios of the first to fourth sub-pixels SP21, SP22, SP23, and SP24 according to the comparative embodiment are 21.9%, 41.2%, 36.1%, and 21.4%, respectively. That is, it is understood that the aperture ratios of the first to fourth sub-pixels SP1, SP2, SP3, and SP4 according to the example embodiment are higher than the first to fourth sub-pixels SP21, SP22, SP23, and SP24 according to the comparative embodiment.

As described above, in the organic light emitting diode display device according to the present example embodiments, the active layer of at least one transistor disposed in one sub-pixel overlaps any one of the data line 110, the reference voltage line 120, and the driving voltage line 125 and also overlaps any one of the first scan line 100 or the second scan line 130. Therefore, the circuit area may be reduced and the aperture unit may be broadened. By doing this, the organic light emitting diode display device, specifically, a large size organic light emitting diode display device may have an improved luminance and a lifespan of the organic light emitting display diode may extend.

Further, a position of the active layer of at least one transistor which is disposed in one sub-pixel is changed, thereby adjusting a size of the circuit area for every sub-pixel.

The features, structures, effects, and the like described in the above example embodiments are included in at least one example embodiment and but are not limited to one example embodiment. In addition, the features, structures, effects, and the like described in the respective example embodiments may be executed by those skilled in the art while being combined or modified with respect to other embodiments. Accordingly, it will be understood that contents related the combination and modification will be included in the scope of the present disclosure.

Further, it should be understood that the example embodiments described above should be considered in a descriptive sense only and not for purposes of limitation. It will be understood by those skilled in the art that various other modifications and applications may be made therein without departing from the spirit and scope of the example embodiments. For example, respective components exhibited in detail in the example embodiments may be executed while being modified.

What is claimed is:

1. An organic light emitting display panel comprising:
a data line and a first scan line disposed to intersect each other;
a plurality of pixels each including a red sub-pixel, a green sub-pixel, a blue sub-pixel and a white sub-pixel as a plurality of sub-pixels;
a second scan line disposed to be parallel to the first scan line;
a driving voltage line and a reference voltage line disposed to be parallel to the data line; and
a plurality of active layers for the plurality of sub-pixels,
wherein at least one active layer of at least one sub-pixel among the plurality of sub-pixels overlaps any one of the data line, the driving voltage line, and the reference voltage line, and also overlaps the first or second scan line,
wherein the at least one active layer overlaps any one of the data line, the driving voltage line, and the reference voltage line, and also overlaps the first or second scan line, in an entire channel region of the at least one active layer,
wherein each sub-pixel of the plurality of sub-pixels includes a driving transistor, a switching transistor and a sensing transistor,
each of the switching transistor and the sensing transistor includes one active layer including one channel region,
a first channel region of the switching transistor overlaps the first scan line and the data line, and
a second channel region of the sensing transistor overlaps the second scan line and the reference voltage line, and
wherein in all of the plurality of sub-pixels, the first channel region to which a data voltage is transferred overlaps with the data line, and the second channel region to which a reference voltage is transferred overlaps with the reference voltage line.

2. The organic light emitting display panel according to claim 1, wherein the plurality of sub-pixels each includes a circuit area and an emission area, and
the plurality of active layers are disposed in the respective circuit area of the plurality of sub-pixels.

3. The organic light emitting display panel according to claim 1, wherein the at least one active layer includes a source region, a drain region, and a channel region, and
a conducting property is imparted to the source region and the drain region of the at least one active layer.

4. The organic light emitting display panel according to claim 1, wherein the at least one active layer is disposed on a substrate,
the first or second scan line is disposed on the at least one active layer, and
the data line, the driving voltage line, or the reference voltage line is disposed on the first or second scan line.

5. The organic light emitting display panel according to claim 1, wherein the at least one active layer which overlaps the first scan line overlaps the data line.

6. The organic light emitting display panel according to claim 5, further comprising:
a plate disposed on the same layer as the data line and forming a part of a capacitor of each sub-pixel,
wherein the plate is disposed on the active layer to be spaced apart from the data line.

7. The organic light emitting display panel according to claim 1, wherein the at least one active layer which overlaps the second scan line overlaps any one of the driving voltage line and the reference voltage line.

8. The organic light emitting display panel according to claim 7, further comprising:
a floating pattern disposed on the same layer as the driving voltage line and the reference voltage line and being connected to a capacitor of each sub-pixel,
wherein the floating pattern is disposed on the at least one active layer to be spaced apart from the driving voltage line or the reference voltage line.

9. The organic light emitting display panel according to claim 1, wherein each sub-pixel further includes at least two transistors,
an active layer of one transistor of the at least two transistors overlaps the first scan line and the data line, and
an active layer of the other one transistor of the at least two transistors overlaps the second scan line and the driving voltage line or the reference voltage line.

10. The organic light emitting display panel according to claim 9, wherein each transistor comprises:
the active layer on a substrate, the active layer having a channel region;
a gate insulating layer disposed on a part of a top surface of the active layer; and
the first scan line, the second scan line, the data line, the driving voltage line, and the reference voltage line being disposed on the gate insulating layer.

11. The organic light emitting display panel according to claim 10, further comprising:
an interlayer insulating layer; and
a floating pattern disposed on an interlayer insulating layer.

12. The organic light emitting diode display device of claim 11, wherein the floating pattern serves as a source or drain electrode of one transistor of the at least two transistors.

13. The organic light emitting display panel according to claim 1, wherein each transistor is formed without having a source or drain electrode which is branched from the data line, the driving voltage line, or the reference voltage line.

14. An organic light emitting display panel, comprising:
the organic light emitting display panel according to claim 1;
a data driver configured to drive a plurality of data lines of the organic light emitting display panel;
a gate driver configured to drive a plurality of gate lines of the organic light emitting display panel; and
a timing controller configured to control the data driver and the gate driver.

15. The organic light emitting display panel according to claim 1, wherein the at least one active layer is disposed on a substrate,
wherein a gate insulating layer is disposed on a part of a top surface of the at least one active layer,
wherein the first or second scan line is disposed on the entire channel region of the at least one active layer,
wherein an interlayer insulating layer is disposed on the first or second scan line, and
wherein the data line, the driving voltage line, or the reference voltage line is disposed on the first or second scan line.

16. The organic light emitting display panel according to claim 1, wherein the first scan line and the second scan line are spaced apart from each other to be parallel in a first direction, and
wherein the data line, the driving voltage line, and the reference voltage line are spaced apart from each other to be parallel in a second direction intersecting the first direction.

17. The organic light emitting display panel according to claim 1, wherein at least two active layers of the at least one sub-pixel are spaced apart from each other.

18. The organic light emitting display panel according to claim 1, wherein at least one of the first scan line and the second scan line includes a split enclosing an aperture.

19. The organic light emitting display panel according to claim 18, wherein at least one of the data line, the driving voltage line, and the reference voltage line intersects the aperture.

20. The organic light emitting display panel according to claim 18, wherein a contact hole where the one active layer of the switching transistor and the data line are in contact is disposed in the aperture.

21. The organic light emitting display panel according to claim 18, wherein a contact hole where the one active layer of the sensing transistor and the reference voltage line are in contact is disposed in the aperture.

22. The organic light emitting display panel according to claim 1, wherein one driving voltage line is disposed for each of two sub-pixels of the plurality of sub-pixels, and the reference voltage line is disposed for one of four sub-pixels of the plurality of sub-pixels.

* * * * *